(12) United States Patent
Boy et al.

(10) Patent No.: US 7,612,294 B2
(45) Date of Patent: Nov. 3, 2009

(54) ELECTRICAL COMPONENT HAVING A FLAT MOUNTING SURFACE

(75) Inventors: Jurgen Boy, Berlin (DE); Klaus Rund, Berlin (DE); Frank Bothe, Berlin (DE)

(73) Assignee: EPCOS AG, Munich (DE)

( * ) Notice: Subject to any disclaimer, the term of this patent is extended or adjusted under 35 U.S.C. 154(b) by 272 days.

(21) Appl. No.: 10/433,133

(22) PCT Filed: Sep. 5, 2001

(86) PCT No.: PCT/EP01/10234

§ 371 (c)(1),
(2), (4) Date: Dec. 11, 2003

(87) PCT Pub. No.: WO02/45469

PCT Pub. Date: Jun. 6, 2002

(65) Prior Publication Data

US 2004/0094330 A1    May 20, 2004

(30) Foreign Application Priority Data

Nov. 30, 2000    (DE) ................................ 100 59 534

(51) Int. Cl.
H05K 1/16    (2006.01)

(52) U.S. Cl. ................. 174/260; 174/259; 361/120; 361/760

(58) Field of Classification Search ......... 361/760–761, 361/118–121; 333/117–120, 180–185; 174/50, 174/58–61
See application file for complete search history.

(56) References Cited

U.S. PATENT DOCUMENTS

| | | | | | |
|---|---|---|---|---|---|
| 2,545,546 | A | * | 3/1951 | Fisher | ....................... 174/31 S |
| 3,908,625 | A | * | 9/1975 | Romy | ......................... 123/267 |
| 4,693,179 | A | * | 9/1987 | Watts | ......................... 101/119 |
| 4,695,927 | A |   | 9/1987 | Barre | |
| 4,801,904 | A | * | 1/1989 | Sakamoto et al. | ............ 333/182 |
| 4,851,946 | A | * | 7/1989 | Igarashi et al. | ............... 361/124 |
| 4,886,533 | A | * | 12/1989 | Sakashita et al. | ............... 55/498 |
| 4,999,034 | A | * | 3/1991 | Mager et al. | ................ 96/117.5 |
| 5,103,135 | A |   | 4/1992 | Lange et al. | |
| 5,569,972 | A | * | 10/1996 | Lange | .................... 313/231.11 |
| 5,786,745 | A |   | 7/1998 | Elliott et al. | |
| 5,892,648 | A | * | 4/1999 | Bobert et al. | ................ 361/120 |
| 6,042,683 | A |   | 3/2000 | Hagn | |

(Continued)

FOREIGN PATENT DOCUMENTS

DE    27 31 998    1/1979

(Continued)

OTHER PUBLICATIONS

English Translation of International Preliminary Examination Report of International application PCT/EP01/10234, Nov. 30, 2000.

*Primary Examiner*—Tuan T Dinh
(74) *Attorney, Agent, or Firm*—Fish & Richardson P.C.

(57) ABSTRACT

An electrical component includes a base object made of two insulating objects with curved external surfaces, and external electrodes. Each of the external electrodes is disposed adjacent to one of the two insulating objects. A central electrode is disposed inside of the base object. The central electrode includes a flat mounting surface on an exterior of the component.

19 Claims, 2 Drawing Sheets

U.S. PATENT DOCUMENTS

| | | | |
|---|---|---|---|
| 6,445,560 B1 * | 9/2002 | Bobert et al. | 361/120 |
| 6,549,389 B2 * | 4/2003 | Anthony et al. | 361/117 |
| 6,724,605 B1 * | 4/2004 | Boy et al. | 361/120 |
| 6,797,027 B2 * | 9/2004 | Stenersen et al. | 55/350.1 |

FOREIGN PATENT DOCUMENTS

| | | |
|---|---|---|
| DE | 38 33 167 | 3/1990 |
| DE | 197 44 455 | 4/1998 |
| JP | 03277007 | 12/1991 |
| WO | WO 97/25843 | 7/1997 |
| WO | WO 97/49151 | 12/1997 |

* cited by examiner

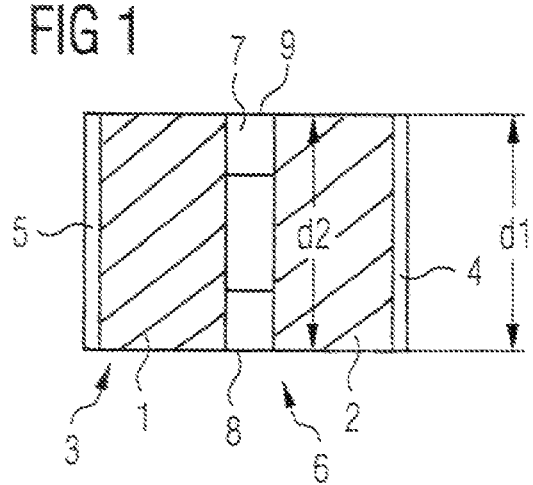
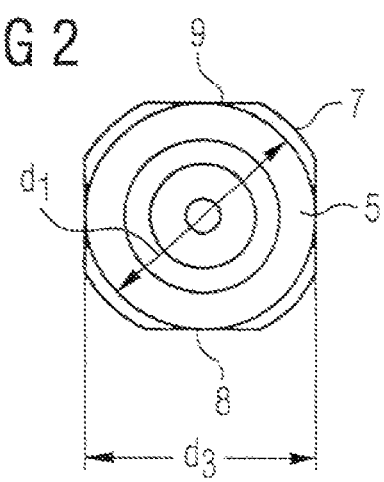
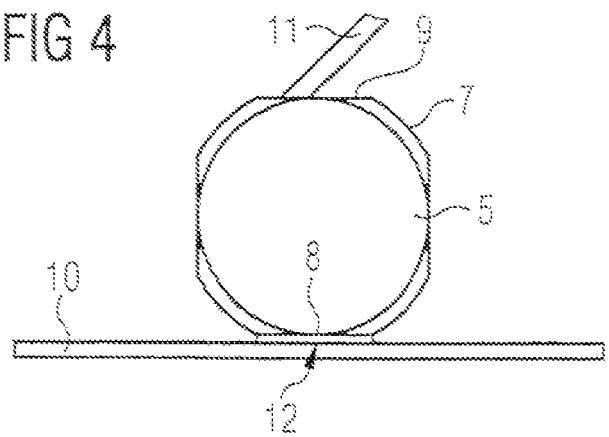

ELECTRICAL COMPONENT HAVING A FLAT MOUNTING SURFACE

CROSS-REFERENCE TO RELATED APPLICATIONS

This patent application claims priority of PCT Application No. PCT/EP01/10234, filed on Sep. 5, 2001, and to German Patent Application No. 100 59 534.0, filed on Nov. 30, 2000.

TECHNICAL FIELD

This patent application relates to an electrical component with a base object, which comprises two insulating objects will curved external surfaces, each having an external electrode disposed on its face. In addition, a central electrode is disposed along a shell surface in a central section of the base object.

BACKGROUND

Components are known for use as surge diverters or as switching spark paths. To be able to solder these components onto printed circuit boards using surface mounting technology, the components must be capable of being placed, in the correct position, into pockets of a transport belt as well as onto the printed circuit board. Rolling away of the component on the printed circuit board or in the belt pockets is not desired. Furthermore, the connection surfaces of the components should be large enough to permit reliable soldering.

To avoid rolling away, printed specification WO 97/25843 discloses providing the external electrodes and/or the central electrode of the component with leads molded onto the component in a foot-like manner. These leads are specially shaped and are welded, clamped or soldered to the component, so as to produce a mechanically solid and electrically conductive connection.

Because of the additionally soldered leads, the components known in the art are disadvantageous because they require additional space. This is because the leads are bent laterally away from the component. Another drawback of known components is that additional costs are incurred to produce, shape and attach the leads.

Another drawback of known components is that the leads exhibit a substantial thermal capacity, which leads to problems during simultaneous soldering with other, smaller components that generally exhibit a very low thermal capacity. This is because a specific heat sufficient to melt the solder must be provided during the soldering process. If components with a larger thermal capacity must be soldered into place, a correspondingly elevated amount of heat is released by the solder bath to the printed circuit board and/or the component. This elevated amount of heat can easily destroy smaller components.

SUMMARY

This patent application describes an electrical component that comprises a base object, which comprises two insulating objects with curved external surfaces. An external electrode is disposed on individual faces of the base object. A central electrode is disposed along a shell surface in a central section of the base object. This central electrode comprises a flat mounting surface on the exterior of the component, which protrudes, at least partially, from the outer contour of the component.

To simplify production, both the insulating objects and the external electrodes can be shaped to be cylindrically symmetrical.

One advantage of the component is that the flat mounting surface of the central electrode provides an enlarged soldering area, thus providing the opportunity for an improved soldered attachment to a printed circuit board.

In addition, the flat mounting surface prevents the component, with its curved external surfaces, from rolling away on a printed circuit board.

With the component, therefore, additional leads can be eliminated, as a result of which the component is characterized by reduced spatial requirements, which proves to be advantageous in light of the maximum integration of components in electrical modules. Furthermore, elimination of leads can reduce both the costs of manufacturing the component and its thermal capacity.

The central electrode of the component may include a flat holding surface, which is disposed opposite the mounting surface. Because of this flat holding surface, the component can be held in place with a suction nozzle, and is thus suitable for use in assembly machines operating on the basis of the pick-and-place principle.

It is also advantageous when the central electrode is a disk disposed between the insulating objects. Such an embodiment corresponds to the structure of a triple-electrode protector, in which the central external contact and the internal electrode of the protector are integrated into the central electrode in one piece.

Various embodiments exist for structuring the central electrode. For example, the central electrode can, in cross-section, take the form of a square, a hexagon or an octagon. In addition, the central electrode can, in cross-section, take the form of a square with rounded corners or the form of a circle with two opposed flattened areas. Suitable embodiments can be selected, depending on the manufacturing process for the central electrode.

Possible manufacturing processes for the central electrode include, for example, cold extrusion or stamping of the central electrode, or turning it on a lathe, from slices cut from a semi-finished rod. In this process, it should be noted that in the case of conventional triple-electrode protectors, the central electrodes do not take the form of a flat disk, but rather the form of a profiled disk, wherein protrusions are provided toward the center of the disk.

If the component is used as a triple-electrode protector, a hollow space filled with a gas can be disposed in the interior of the base object.

This patent application also describes an arrangement of the component, in which the mounting surface is soldered to the surface of a printed circuit board. Because of the design of the component, the component is easily manufactured the component cannot easily become dislodged, by rolling away, once it has been secured to the printed circuit board.

This patent application also describes a method for manufacturing the foregoing arrangement. The method comprises the following:

a) suction holding of the component at the holding surface of the central electrode using a suction nozzle;

b) positioning of the component on the printed circuit board, using the suction nozzle, in such a way that the component rests with its mounting surface on the surface of the printed circuit board;

c) soldering the component into place.

This method is advantageous because it is suitable for use in pick-and-place machines as well as other assembly machines. Thus, the component can be assembled onto a large number of printed circuit boards within a short period of time.

In addition, the component, because of its flat holding and/or mounting surface, is also suitable for transport in pockets of component belts. Because of the flat surfaces, the component does not roll away as easily within the pocket, which normally has a flat floor, as a result of which a defined position, for example with the holding surface facing upward, can be easily set and maintained.

The following describes the component in greater detail on the basis of embodiment examples and the corresponding figures:

DESCRIPTION OF THE DRAWINGS

FIG. 1 depicts, as an example, a component in a schematic side view.

FIG. 2 depicts the component of FIG. 1 in an additional side view.

FIG. 4 depicts, as an example, an arrangement of the component in a side view.

DETAILED DESCRIPTION

Figure 3A:
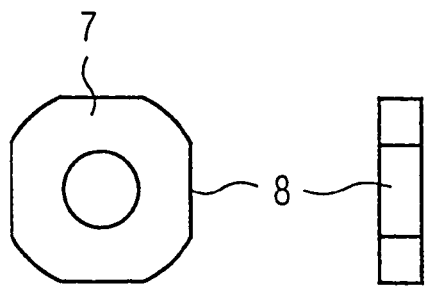
FIG. 3A to 3E depict, as examples, various embodiments of the central electrode suitable for use in the component, each shown in an aerial view and a side view.

FIG. 1 depicts a component with a base object 3, which comprises two insulating objects 1 and 2. The insulating objects 1 and 2 are cylindrical shaped ceramic sleeves. The ceramic sleeves are soldered to be gastight, by means of hard solder, to a central electrode 7 made of metal, such as copper. The central electrode 7 is disposed in a central section 6 of the base object 3.

As a result of the gastight soldering, it is possible to dispose a gastight hollow space in the interior of the base object 3. The central electrode 7 features a mounting surface 8 and a holding surface 9. Both surfaces 8 and 9 are flat. External electrodes 4 and 5 are attached to the faces of the base object 3.

In the embodiment shown in FIG. 1, the external electrodes 4 and 5 and the insulating objects 1 and 2 are designed to be cylindrically symmetrical. The diameter d1 of the external electrodes 4 and 5 is equal to the diameter d2 of the insulating objects 1 and 2. However, in another embodiment, the diameter d1 of the external electrodes 4 and 5 is larger than the diameter d2 of the insulating objects 1 and 2. An additional embodiment of this nature would not be disadvantageous in terms of the ability to solder the component to a printed circuit board.

FIG. 2 depicts the component of FIG. 1 in a side view. The reference numbers in FIG. 2 correspond to those in FIG. 1. The shape of the central electrode 7, in cross-section, is as depicted in FIG. 3A. In addition to the mounting surface 8 and the holding surface 9, the central electrode 7 also features two other lateral, flat surfaces. The smallest diameter d3 of the central electrode 7 is exactly equal to the diameter d2 of the insulating objects 1 and 2 and/or the diameter d1 of the external electrodes 4 and 5. This ensures that the entire area of the mounting surface 8 protrudes from the contour of the component, and can thus optimally fulfill its function as a positional stabilizer. However, the smallest diameter d3 of the central electrode 7 may also be larger than the diameter d1 of the external electrodes 4 and 5.

The inner circles of the external electrode 5 depicted in FIG. 2 indicate a spherical cap-like recess and/or a connection slug disposed therein.

FIGS. 3A to 3E depict various embodiments of the central electrode 7 in aerial and side views. In each case, the mounting surface 8 and/or the holding surface 9 are shown. The hole depicted in the center of each central electrode 7 is needed for the gas-filled hollow space in the interior of the base object of the component.

Figure 3B:
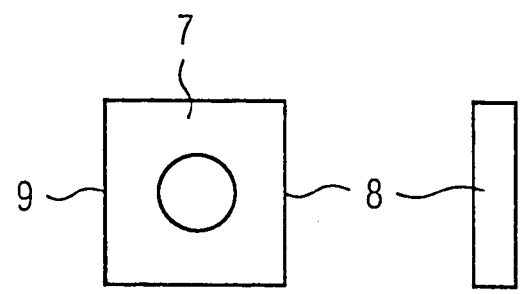
Figure 3C:
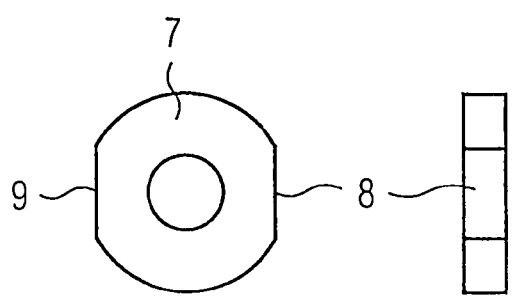
Figure 3D:
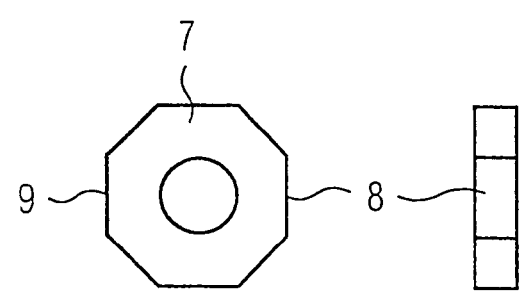
Figure 3E:
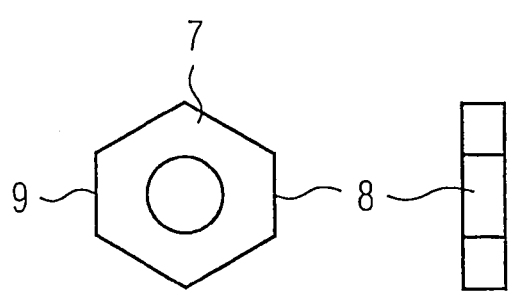

FIG. 3A depicts a central electrode 7 in the form of a square with rounded corners. FIG. 3B depicts said electrode in the form of a whole square, FIG. 3C in the form of a circle with two flattened areas on opposite sides, FIG. 3D in the form of an octagon and FIG. 3E in the form of a hexagon.

FIG. 4 depicts an arrangement of the component, wherein the reference numbers in FIG. 4 correspond to those in FIG. 2. The mounting surface 8 of the component rests on the surface of a printed circuit board 10. The component is soldered to the printed circuit board 10 by means of solder 12. The positioning of the component on the printed circuit board 10 can be accomplished, for example, by means of a suction nozzle 11, which sucks the component to the upper holding surface 9.

The component is not limited to the embodiments described above.

What is claimed is:

1. An electrical component comprising:
    a base object comprised of two insulating objects with curved external surfaces;
    external electrodes, each of the external electrodes being disposed adjacent to one of the two insulating objects; and
    a central electrode disposed inside of the base object, the central electrode comprising a flat mounting surface on an exterior of the electrical component, the flat mounting surface on the exterior of the electrical component being one of first and second surfaces of the central electrode that are flat.

2. The electrical component according to claim 1, wherein the two insulating objects and the external electrodes are cylindrically symmetrical.

3. The electrical component according to claim 1, wherein the central electrode further comprises a flat holding surface opposite the flat mounting surface.

4. The electrical component according to claim 1, wherein the central electrode comprises a disk disposed between the two insulating objects.

5. The electrical component according to claim 1, wherein the external electrodes have a circular cross-section.

6. The electrical component according to claim 1, wherein an interior of the base object is hollow and filled with a gas.

7. The electrical component according to claim 4, wherein a cross section of the central electrode comprises of a square, a hexagon, and an octagon.

8. The electrical component according to claim 4, wherein a cross section of the central electrode comprises a square with rounded corners.

9. The electrical component according to claim 4, wherein a cross section of the central electrode comprises a circle with two opposed flattened areas.

10. The electrical component according to claim 5, wherein a diameter of the external electrodes is substantially equal to a diameter of the insulating objects.

11. The electrical component according to claim 5, wherein a diameter of the external electrodes is larger than a diameter of the insulating objects.

12. The electrical component according to claim 5, wherein a smallest diameter of the central electrode is less than or equal to a diameter of the external electrodes.

13. An apparatus comprising:
    a printed circuit board; and an electrical component mounted to the printed circuit board, a flat mounting surface of the electrical component being soldered to a surface of the printed circuit board;

wherein the electrical component comprises:

a base object comprised of two insulating objects with curved external surfaces;

external electrodes, each of the external electrodes being disposed adjacent to one of the two insulating objects; and a central electrode disposed inside of the base object, the central electrode comprising the flat mounting surface on an exterior of the electrical component.

14. A method for manufacturing a printed circuit board having an electrical component, the electrical component comprising (i) a base object comprised of two insulating objects with curved external surfaces, (ii) external electrodes, each of the external electrodes being disposed adjacent to one of the two insulating objects, and (iii) a central electrode disposed inside of the base object, the central electrode comprising a flat mounting surface on an exterior of the electrical component, the method comprising:

holding the electrical component to the printed circuit board at a holding surface of the central electrode using a suction nozzle;

positioning the electrical component on the printed circuit board using the suction nozzle so that the flat mounting surface of the electrical component is on surface of the printed circuit board; and soldering the electrical component into place on the printed circuit board.

15. An electrical component comprising:

a central electrode comprising at least one mounting surface that is substantially flat on an exterior of the electrical component, the at least one mounting surface being one of first and second surfaces of the central electrode that are substantially flat;

insulating objects that bound the central electrode; and external electrodes, each of which is adjacent to one of the insulating objects, the insulating objects each having a curved external surface.

16. The electrical component of claim 15, wherein at least one of the insulating objects comprises a ceramic sleeve and is substantially cylindrical.

17. The electrical component of claim 15, wherein the central electrode is made of metal.

18. The electrical component of claim 15, wherein the central electrode includes a hole, gas being inside the hole.

19. The electrical component of claim 15, which acts as a diverter.

* * * * *